(12) United States Patent
Tserng et al.

(10) Patent No.: US 7,746,173 B1
(45) Date of Patent: Jun. 29, 2010

(54) POWER AMPLIFIER WITH OUTPUT HARMONIC RESONATORS

(75) Inventors: Hua-Quen Tserng, Dallas, TX (US); Warren Robert Gaiewski, Lavon, TX (US); David Michael Fanning, Garland, TX (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 12/113,008

(22) Filed: Apr. 30, 2008

(51) Int. Cl.
*H03F 3/68* (2006.01)
(52) U.S. Cl. ...................... 330/295; 330/302
(58) Field of Classification Search ................ 330/295, 330/124 R, 286, 84
See application file for complete search history.

(56) References Cited

U.S. PATENT DOCUMENTS

| | | | |
|---|---|---|---|
| 6,060,951 A * | 5/2000 | Inoue | 330/307 |
| 6,670,801 B2 | 12/2003 | Jian | |
| 6,724,255 B2 * | 4/2004 | Kee et al. | 330/251 |
| 7,193,472 B2 * | 3/2007 | Gotou et al. | 330/295 |
| 7,215,221 B1 * | 5/2007 | Ellis et al. | 333/125 |
| 7,310,019 B2 | 12/2007 | Gotou | |
| 7,443,236 B2 * | 10/2008 | Dow et al. | 330/51 |
| 7,511,575 B2 * | 3/2009 | Gotou et al. | 330/295 |
| 7,518,451 B2 * | 4/2009 | Pribble et al. | 330/251 |
| 2008/0315392 A1 * | 12/2008 | Farrell et al. | 257/691 |

OTHER PUBLICATIONS

Roff, et al., "Design Approach for Realization of Very High Efficiency Power Amplifiers," IEEE International Microwave Symposium Digest, pp. 143-146, Jun. 2007.
Grebennikov, "Circuit Design Technique for High Efficiency Class F Amplifiers," IEEE International Microwave Symposium Digest, pp. 771-774, Jun. 2000.
Goto, et al., "A Low Distortion 25 W Class-F Power Amplifier Using Internally Harmonic Tuned FED Architecture for 3.5 GHz OFDM Applications," IEEE International Microwave Symposium Digest, pp. 1538-1541, Jun. 2006.
Raab, "Idealized Operation of the Class E Tuned Power Amplifier," IEEE Trans. Circuits Systems, vol. CAS-25, pp. 725-735, Dec. 1977.

* cited by examiner

*Primary Examiner*—Robert Pascal
*Assistant Examiner*—Hieu P Nguyen
(74) *Attorney, Agent, or Firm*—Schwabe Williamson & Wyatt

(57) ABSTRACT

Embodiments of circuits and systems for a radio frequency (RF) power amplifier employing output harmonic resonators are disclosed. The RF power amplifiers may include amplification circuitry having unit cells and output harmonic resonators co-disposed on a chip. In some embodiments, each unit cell may be coupled with a respective output harmonic resonator. Other embodiments may be described and claimed.

23 Claims, 9 Drawing Sheets

POWER AMPLIFIER WITH OUTPUT HARMONIC RESONATORS

FIELD

Embodiments of the present disclosure relate generally to the field of circuits, and more particularly to a power amplifier with output harmonic resonators.

BACKGROUND

Radio frequency (RF) power amplifiers are used in wireless transmission devices to amplify an RF signal for transmission. Power consumption is a concern for users and manufacturers of these wireless transmission devices. One of the factors in determining the power consumption in such devices is the direct current (DC)-to-RF conversion efficiency of the RF power amplifiers. DC-to-RF conversion efficiency may be a measure of how much DC power is converted into RF energy.

High DC-to-RF conversion efficiencies have been demonstrated at a unit-cell level. However, when RF power amplifiers employ multiple unit cells, efficiency degrades due to these devices failing to provide desired impedance matching across fundamental and harmonic operating frequencies.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

As used herein, "coupled with" may mean either one or both of the following: a direct coupling or connection, where there is no other element coupled or connected between the elements that are said to be coupled with each other; or an indirect coupling or connection, where one or more other elements are coupled or connected between the elements that are said to be coupled with each other.

Figure 1:
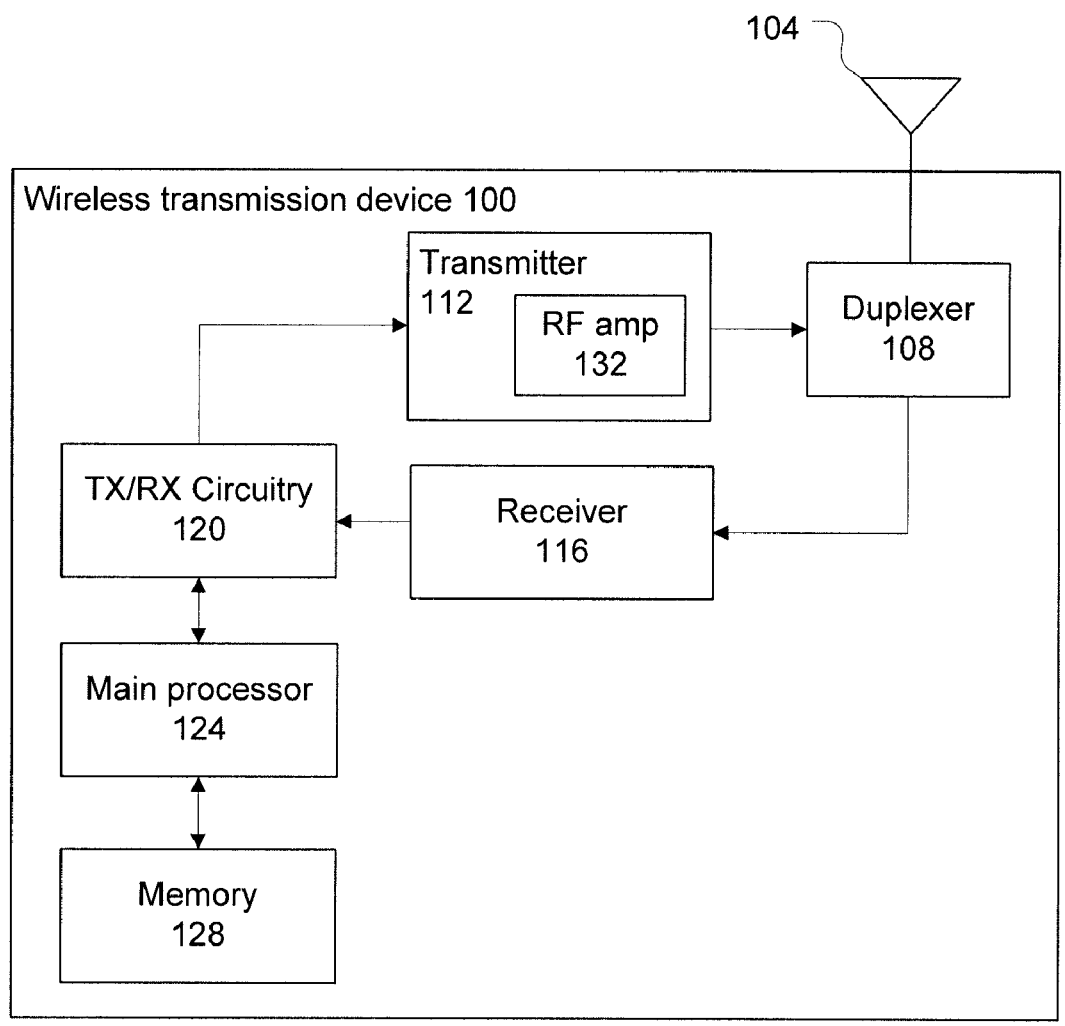
FIG. 1 illustrates a wireless device in accordance with various embodiments.

FIG. 1 illustrates a wireless transmission device 100 in accordance with various embodiments. The wireless transmission device 100 may have an antenna structure 104, a duplexer 108, a transmitter 112, a receiver 116, transmit/receive (TX/RX) circuitry 120, a main processor 124, and a memory 128 coupled with each other at least as shown. While the wireless transmission device 100 is shown with transmitting and receiving capabilities, other embodiments may include wireless transmission devices without receiving capabilities.

In various embodiments, the wireless transmission device 100 may be, but is not limited to, a mobile telephone, a paging device, a personal digital assistant, a text-messaging device, a portable computer, a base station, a radar, a satellite communication device, or any other device capable of wirelessly transmitting RF signals.

The main processor 124 may execute a basic operating system program, stored in the memory 128, in order to control the overall operation of the wireless transmission device 100. For example, the main processor 124 may control the reception of signals and the transmission of signals by TX/RX circuitry 120, receiver 116, and transmitter 112. The main processor 124 may be capable of executing other processes and programs resident in the memory 128 and may move data into or out of memory 128, as desired by an executing process.

The TX/RX circuitry 120 may receive outgoing data (e.g., voice data, web data, e-mail, signaling data, etc.) from the main processor 124. The TX/RX circuitry 120 may transmit an RF signal that represents the outgoing data to the transmitter 112. The transmitter 112 may include an RF power amplifier 132 (hereinafter also referred to as "RF amplifier 132") to amplify the RF signal for transmission. The amplified RF signal may be forwarded to the duplexer 108 and then to the antenna structure 104 for an over-the-air (OTA) transmission.

In a similar manner, the TX/RX circuitry 120 may receive an incoming OTA signal from the antenna structure 104 through the duplexer 108 and receiver 116. The TX/RX circuitry 120 may process and send the incoming signal to the main processor 124 for further processing.

In various embodiments, the antenna structure 104 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless transmission device 100 is given by way of example and that, for simplicity and clarity, only so much of the construction and operation of the wireless transmission device 100 as is necessary for an understanding of the embodiments is shown and described. In addition, or as an alternative, although an exemplary wireless transmission device 100 is shown and described, various embodiments contemplate any suitable component or combination of components performing any suitable tasks in association with wireless transmission device 100, according to particular needs. Moreover, it is understood that the wireless transmission device 100 should not be construed to limit the types of devices in which embodiments may be implemented.

In accordance with various embodiments, the RF amplifier 132 includes output harmonic resonators to facilitate amplification of the RF signal with a high DC-to-RF conversion efficiency. Various embodiments of the RF amplifier 132, its components, and their operation are described in greater detail with respect to FIGS. 2-9.

Figure 2:
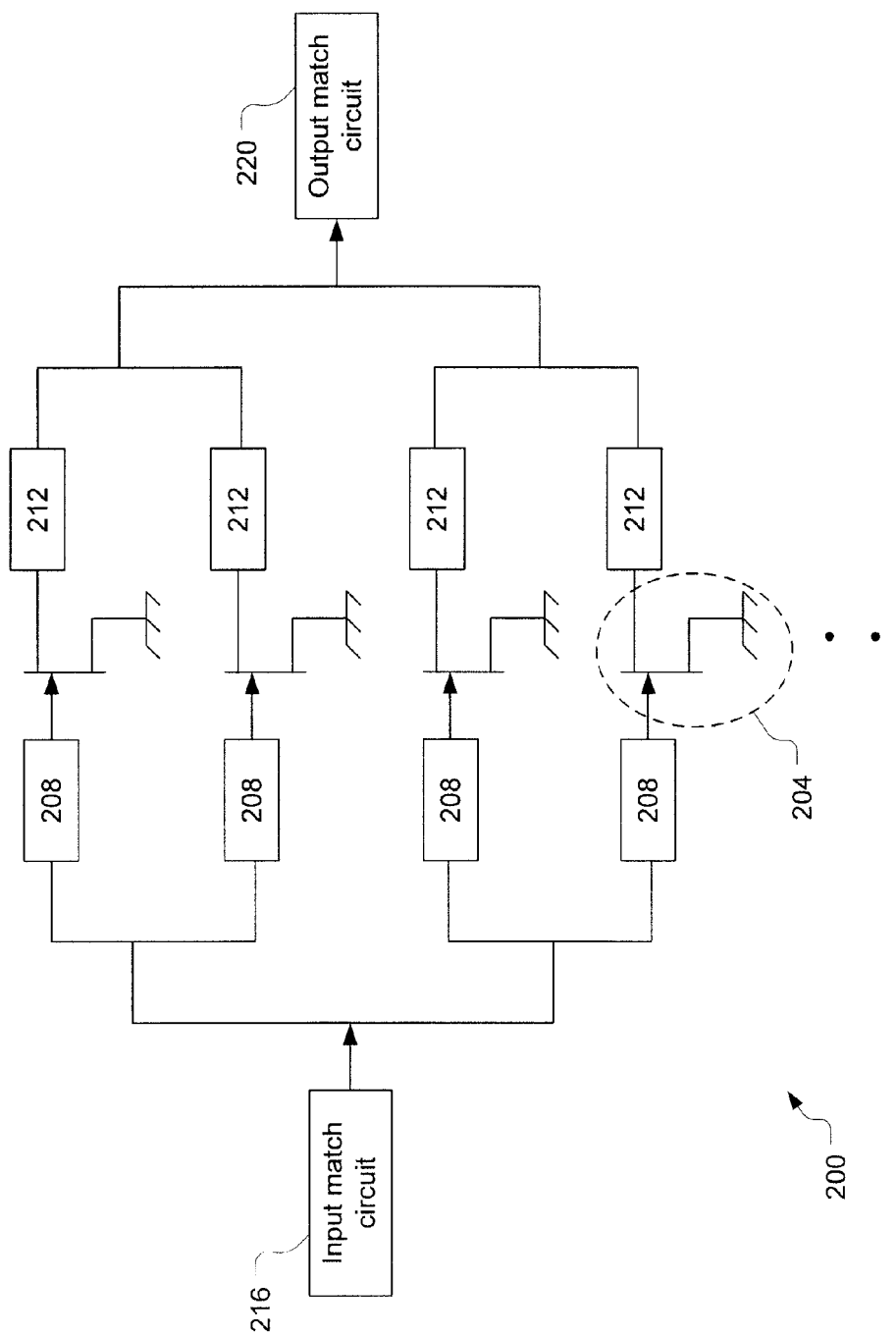
FIG. 2 illustrates amplification circuitry of an RF power amplifier in accordance with various embodiments.

FIG. 2 illustrates amplification circuitry 200 of the RF amplifier 132 in accordance with various embodiments. The amplification circuitry 200 may include a number of unit cells 204 connected in parallel with one another as shown. The unit cells 204 may each have multiple gate fingers. The number and width of the gate fingers may be selected based on a desired operating frequency.

Each of the unit cells 204 may be coupled with a respective input harmonic resonator 208 and a respective output harmonic resonator 212. In particular, the input harmonic resonators 208 may be coupled with respective gate terminals of the unit cells 204, while the output harmonic resonators 208 may be coupled with respective drain terminals of the unit cells 204. The unit cells 204 may have their source terminals coupled to a ground.

The amplification circuitry 200 may receive an RF signal from an input match circuit 216, amplify the RF signal, and provide the amplified RF signal to an output match circuit 220. The input match circuit 216 may transform a source impedance at a fundamental frequency of the RF signal to an impedance that substantially matches the input impedance of the amplification circuitry 200. In a similar manner, the output match circuit 220 may transform a load impedance at the fundamental frequency to an impedance that substantially matches the output impedance of the amplification circuitry 200.

The input and output impedance of the amplification circuitry 200 will be substantially lower than that of an individual unit cell 204 when a number of unit cells are coupled in parallel to achieve a high output power. This may make it difficult to provide desired harmonic impedance terminations at the input match circuit 216 and the output match circuit 220.

Accordingly, an input harmonic resonator 208 and/or an output harmonic resonator 212 may be provided for each unit cell 204 to facilitate harmonic tuning at the unit-cell level. Harmonic tuning may refer to a tuning of the input impedance at the input of the unit cell 204 and/or a tuning of the output impedance at the output of the unit cell 204 across harmonic frequencies. The higher input/output impedances at the unit-cell level, and in particular the higher fundamental impedance that results in a higher fundamentaltoharmonic impedance ratio, may facilitate this harmonic tuning. This may result in a higher DC-to-RF conversion efficiency of the RF amplifier 132 than would otherwise result from using the input match circuit 216 and/or output match circuit 220 for harmonic tuning.

In some embodiments, the input harmonic resonators 208 and/or the output harmonic resonators 212 may be internal resonators. An internal resonator, as used herein, may refer to a resonator that is formed on the same chip as the unit cell 204 with which it is coupled. Harmonic tuning from internal resonators on a unit-cell level may provide the RF amplifier 132 with desired linear and high-efficiency operation over a larger range of operating frequencies than what is currently provided by external resonators that are coupled to multiple unit cells.

The unit cells 204, and any internal resonators, may be formed on a gallium arsenide (GaAs) chip. However, other embodiments may use chips including other semiconductor materials, e.g., silicon, indium phosphide, silicon carbide, etc.

In some embodiments, the unit cells 204 may be field-effect transistors, e.g., heterostructure field-effect transistors (HFETs), metal-semiconductor field effect transistors (MESFETs), high electron mobility transistors (HEMTs) (e.g., GaAs pseudomorphic HEMTs, aluminum gallium nitride (AlGaN)/GaN HMETs and all their derivatives, etc.), etc. Other embodiments may use other transistor technologies such as, but not limited to, bipolar junction transistor (BJT) technology, e.g., heterojunction bipolar transistors (HBTs).

Figure 3:
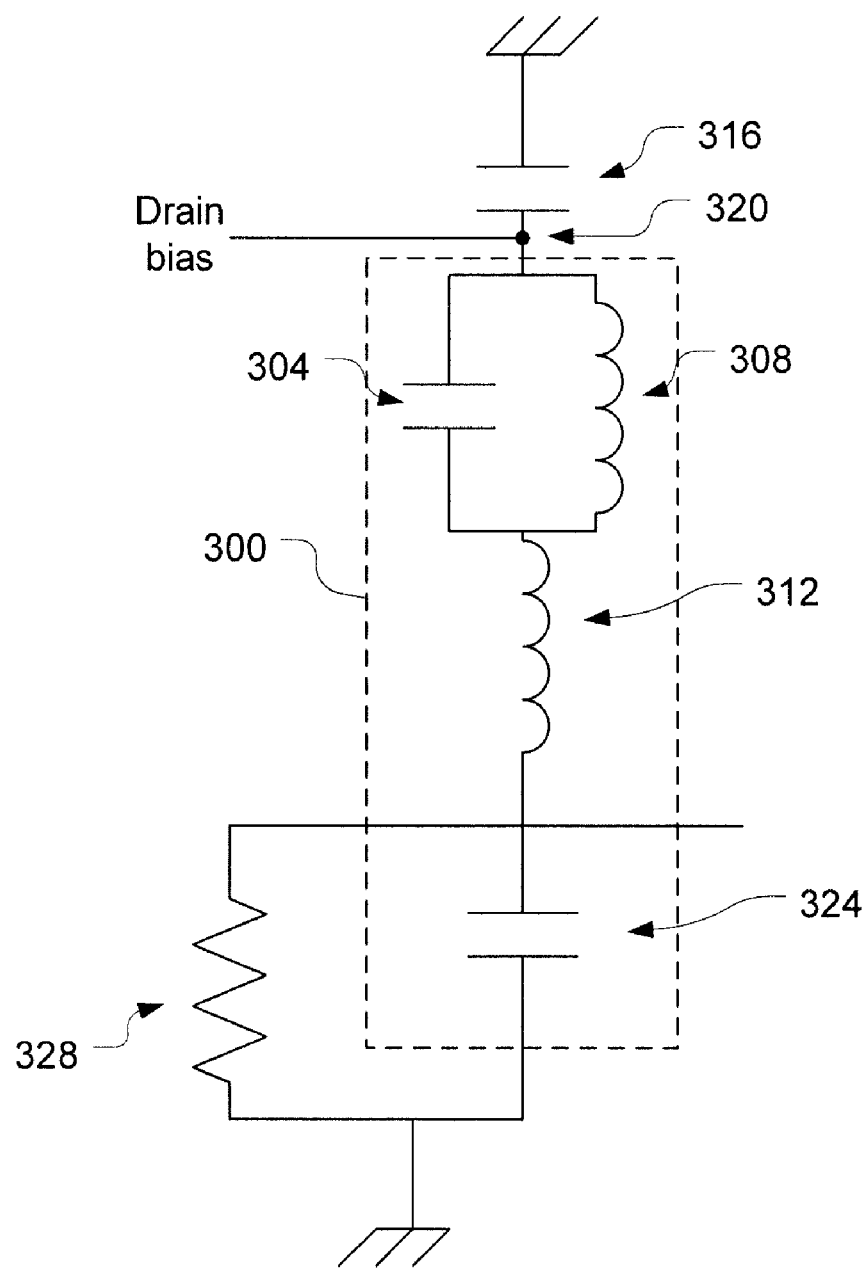
FIG. 3 illustrates an output harmonic resonator in accordance with various embodiments.

FIG. 3 illustrates an output harmonic resonator 300 in accordance with various embodiments. The output harmonic resonator 300 may be similar to, and interchangeable with, the output harmonic resonators 212.

The output harmonic resonator 300 may include a capacitor 304 coupled in parallel with an inductor 308. The output harmonic resonator 300 may also include an inductor 312 coupled in series with the capacitor 304 and inductor 308.

The output harmonic resonator 300 may be coupled with a ground through a capacitor 316 that may function as a bypass capacitor. A drain bias may be provided at a node 320 between the output harmonic resonator 300 and the capacitor 316.

The output impedance at the drain terminal of a unit cell may be represented by a capacitor 324 coupled in parallel with a resistor 328. The unit cell output capacitance and resistance values may depend on the transistor technology that is employed, the size of the transistor, and/or the device layout. As can be seen from the illustrated boundary of the output harmonic resonator 300, the unit cell output capacitance, modeled by the capacitor 324, may be absorbed into the output harmonic resonator 300.

The components of the output harmonic resonator 300 may be co-located on a chip with a unit cell by using metal-insulator-metal (MIM) capacitors and spiral inductors implemented through conventional microwave monolithic integrated circuit (MMIC) processing techniques. Known design equations may be employed to calculate the values desired from the components of the output harmonic resonator 300.

Through operation, the output harmonic resonator 300 may create a series and/or parallel resonance at the harmonic frequencies of the unit cell coupled with the output harmonic resonator 300. For example, the output harmonic resonator 300 may create a parallel resonance at a third harmonic frequency, resulting in a relatively high impedance. The output harmonic resonator 300 may also create, for example, a series resonance at a second harmonic frequency, resulting in a relatively low impedance. Thus, the output harmonic resonator 300 may facilitate provision of desired impedances for matching the impedance of the unit cells across various harmonic frequencies, for high-efficiency and linear operations of the RF amplifier 132.

Figure 4:
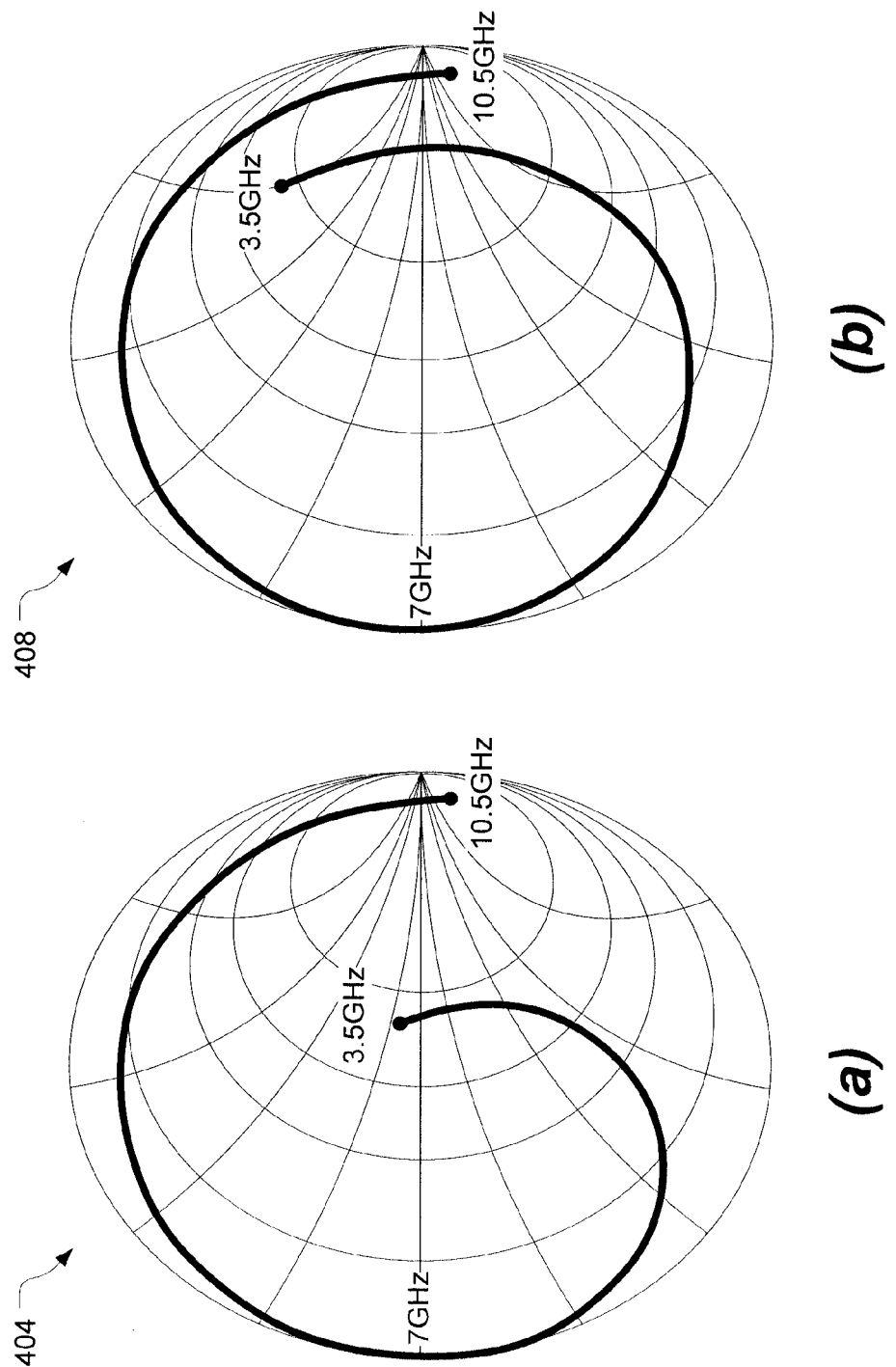
FIG. 4 illustrates Smith chart impedance plots in accordance with various embodiments.

This relationship of the operating frequency to the output impedance of a GaAs pHEMT, for example, is shown by Smith chart impedance plots of FIG. 4 in accordance with some embodiments. In particular, plots 404 and 408 show output impedance corresponding to a fundamental frequency of 3.5 gigahertz (GHz), a second harmonic frequency of 7 GHz, and a third harmonic frequency of 10.5 GHz for two different harmonically-tuned unit cells. Plot 404 shows output impedance provided by an output harmonic resonator for a unit cell having sixteen gate fingers, each gate finger having a width of two-hundred fifty microns (μm). A unit cell with these properties may also be referred to as 16×250 μm unit cell. The plot 408 shows output impedance provided by an output harmonic resonator for a 4×250 μm unit cell. As can be seen by the plots in this example, the output harmonic resonators may provide a series resonance with relatively low output impedance at the second harmonic frequency, while providing parallel resonance with relatively high output impedance at the third harmonic frequency.

Figure 5:
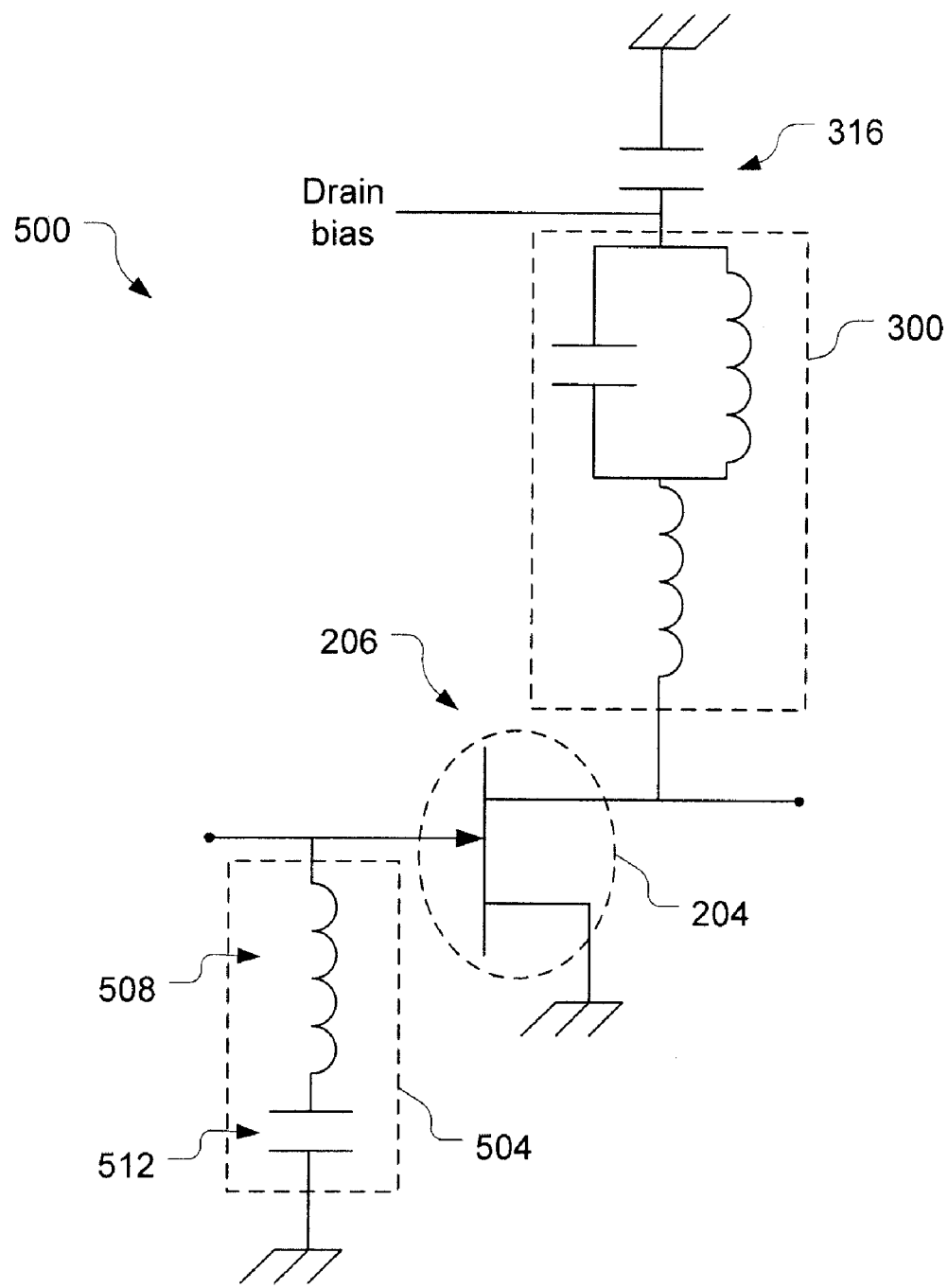
FIG. 5 illustrates a circuit including an input harmonic resonator, a unit cell, and an output harmonic resonator in accordance with various embodiments.

FIG. 5 illustrates a circuit 500 including the unit cell 204 coupled with an input harmonic resonator 504 and the output harmonic resonator 300 in accordance with various embodiments. In particular, the input harmonic resonator 504 may be coupled with a gate terminal of the unit cell 204 and go to a relative ground. The input harmonic resonator 504 may include an inductor 508 coupled in series with a capacitor 512. The inductor 508 may have a first terminal coupled with the gate terminal of the unit cell 204 and a second terminal coupled with the capacitor 512. The input harmonic resonator 504 may provide a series resonance at the second harmonic frequency of the unit cell 204 to provide a short circuit and a correspondingly low impedance as seen from the gate terminal of the unit cell 204.

FIGS. 6(a)-6(b) illustrate layouts of internal harmonic tuned unit cells in accordance with various embodiments. In particular, internal harmonic tuned unit cell 604 of FIG. 6(a) and internal harmonic tuned unit cell 608 of FIG. 6(b) are shown implemented on respective chips. The internal harmonic tuned unit cells 604 and/or 608 may be represented schematically by the circuit 500 in accordance with some embodiments.

The internal harmonic tuned unit cell 604 may include a unit cell 612 having a gate terminal 614 coupled with an input harmonic resonator 616 and further coupled with each of sixteen gate fingers 618 of the unit cell 612 through an interconnect 620. The unit cell 612 may also have a drain terminal 622 coupled with each of sixteen drain fingers 624 through an interconnect 626 and further coupled with an output harmonic resonator 628. The unit cell 612 may be a 16×250 μm unit cell. The input harmonic resonator 616 may have a spiral inductor 632 coupled in series with a capacitor 634. The input harmonic resonator 616 may be coupled between the unit cell 612 and a ground through a via 636 to a backside ground plane.

The output harmonic resonator 628 may include a first spiral inductor 638 coupled in parallel with a capacitor 640. The output harmonic resonator 628 may also include a second spiral inductor 644 coupled in series with the first spiral inductor 638 and the capacitor 640. The output harmonic resonator 628 may also be coupled with a bypass capacitor 648 that is coupled with the backside ground plane through vias 652.

Figure 6:
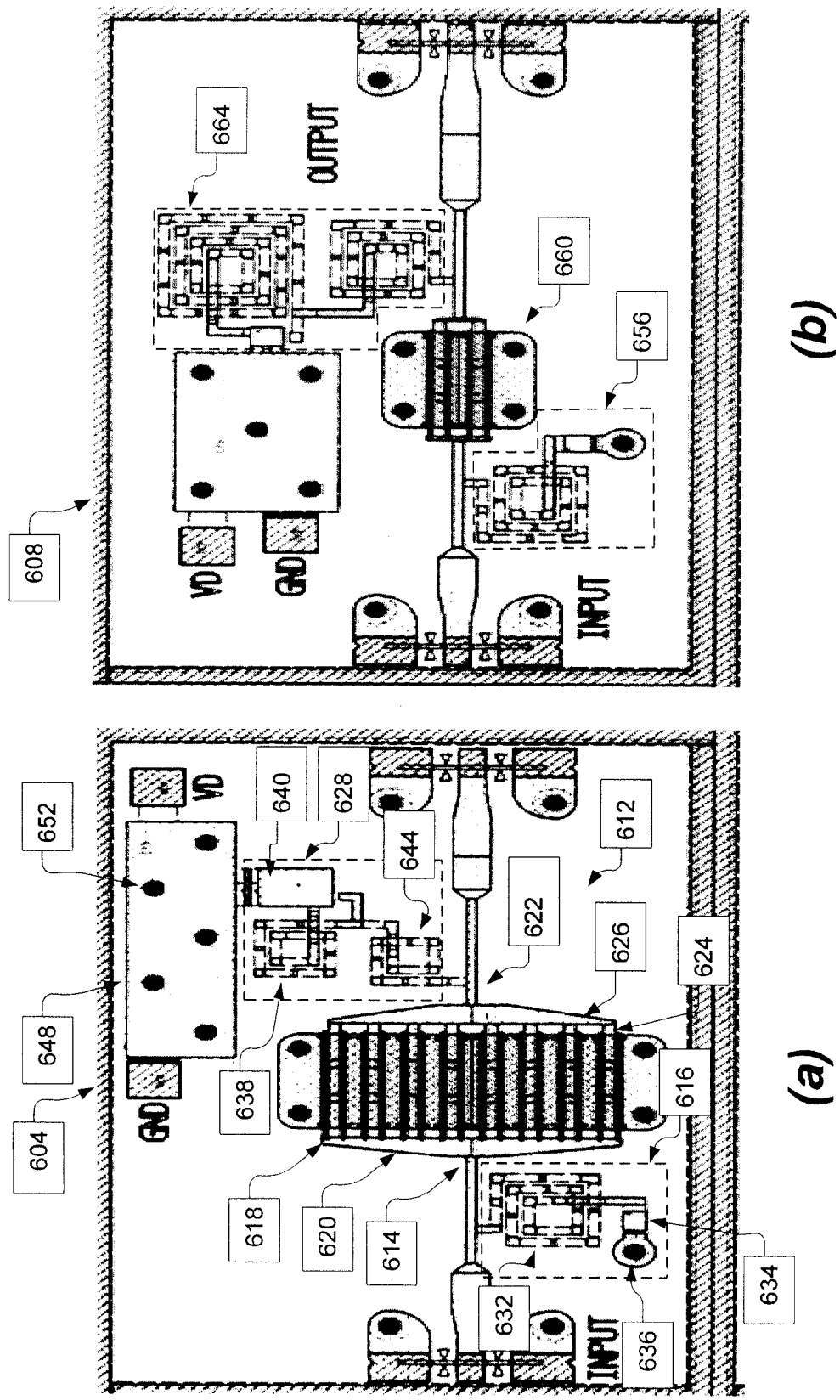
FIG. 6 illustrates layouts of internal harmonic tuned unit cells in accordance with various embodiments.

The internal harmonic tuned unit cell 608 may have components similar to the internal harmonic tuned unit cell 604, including an input harmonic resonator 656, a unit cell 660, and an output harmonic resonator 664. However, the unit cell 660 may be smaller than the unit cell 612. For example, the unit cell 660 may be a 4×250 μm unit cell. The size of the components of the harmonic resonators may be adjusted accordingly. For example, spiral inductors used for a 4×250 μm unit cell may be larger than spiral inductors used for a 16×250 μm unit cell, as is generally shown in FIG. 6.

Figure 7:
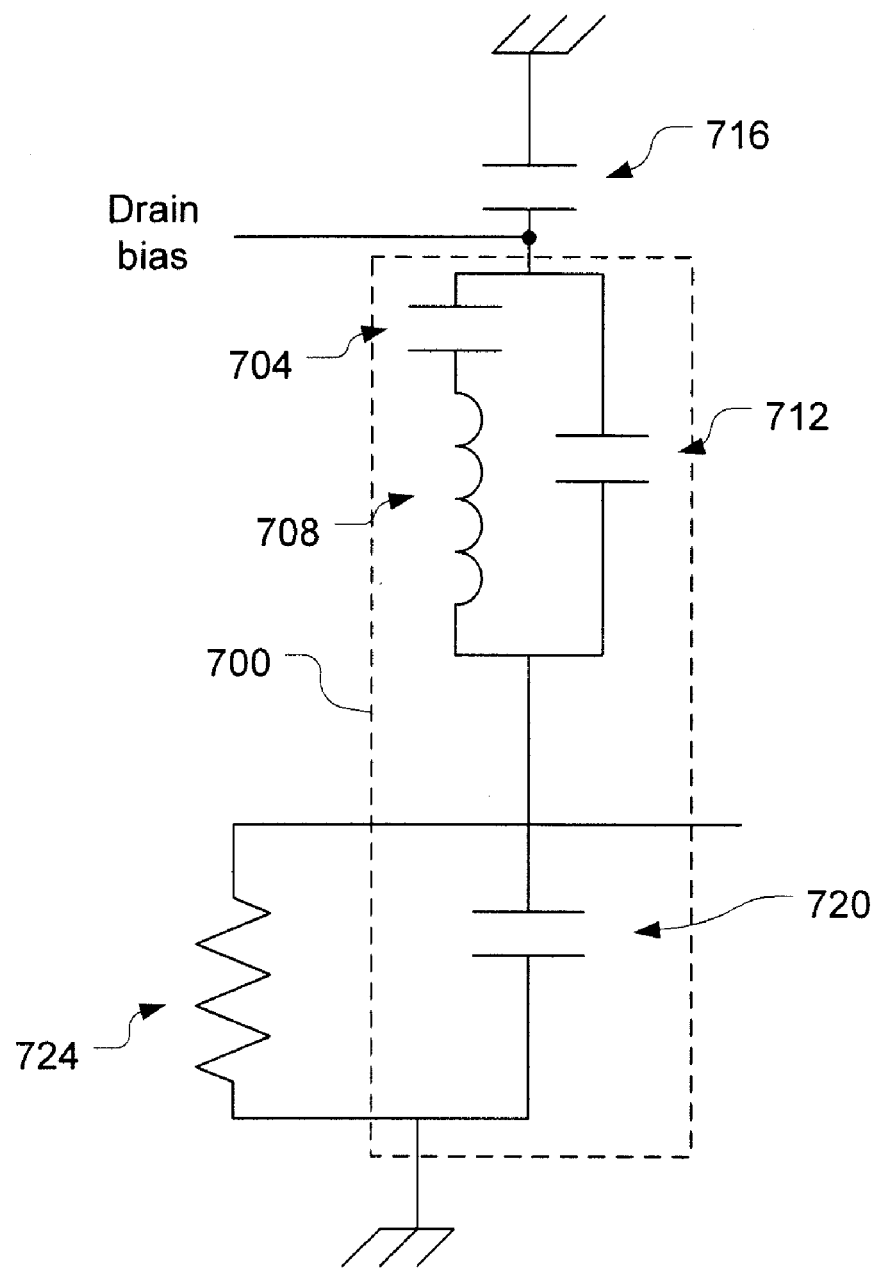
FIG. 7 illustrates an output harmonic resonator in accordance with various embodiments.

FIG. 7 illustrates an output harmonic resonator 700 in accordance with various embodiments. The output harmonic resonator 700 may be substantially interchangeable with the output harmonic resonator 300. The output harmonic resonator 700 may include a capacitor 704 coupled in series with an inductor 708. The output harmonic resonator 700 may also include a capacitor 712 coupled in parallel with the capacitor 704 and the inductor 708.

Similar to the output harmonic resonator 300, the output harmonic resonator 700 may be coupled between a bypass capacitor 716, which goes to a ground, and a drain terminal of a unit cell, modeled by a capacitor 720 and resistor 724. The output harmonic resonator 700 may function similar to the output harmonic resonator 300 described above.

Figure 8:
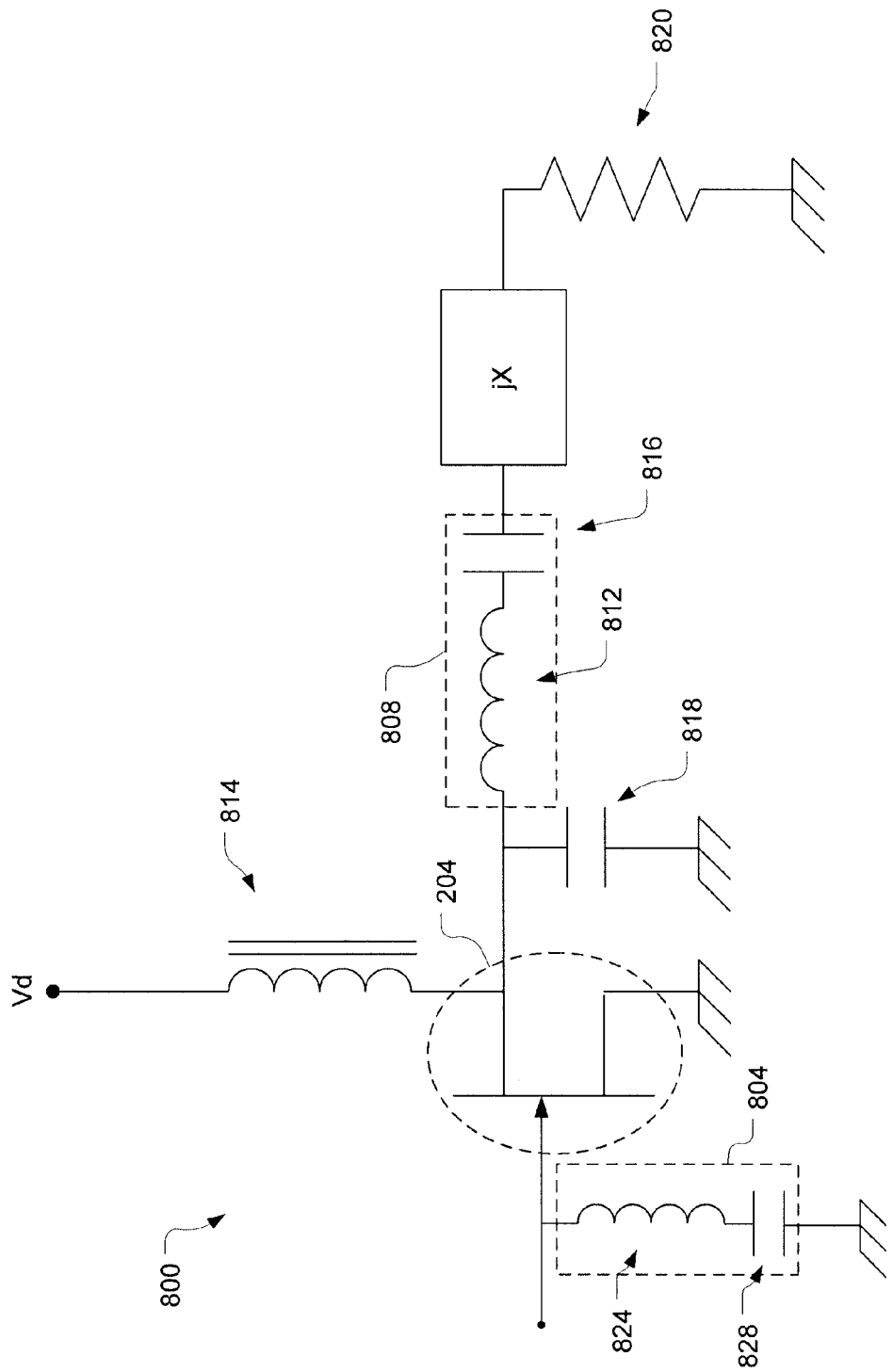
FIG. 8 illustrates an internally-tuned unit cell circuit in accordance with various embodiments.

An RF amplifier employing the internal resonators described in FIGS. 3-7 may be a class F amplifier, which may be a high-efficiency, high-frequency switching power amplifier. However, other embodiments may be used in other types of amplifiers. For example, FIG. 8 illustrates an internal harmonic tuned unit cell circuit 800 that may be used in a class E amplifier in accordance with some embodiments. A class E amplifier may be another type of a high-efficiency, high-frequency switching power amplifier.

The circuit 800, which may be coupled in parallel with other similar circuits as shown in FIG. 2, includes an input harmonic resonator 804 coupled with a gate terminal of a unit cell 204. A drain terminal of the unit cell 204 may be coupled with an output harmonic resonator 808. The output harmonic resonator 808 may be an internal series resonator having an inductor 812 coupled in series with a capacitor 816. An internal series resonator may be a resonator that is particularly suitable for a class E amplifier by being configured, for example, to provide high impedances at all of the harmonic frequencies for desired operation. A series reactance jX, for the fundamental frequency, may be determined by a difference in reactances of the inductor 812 and capacitor 816. A resistor 820 may represent a load impedance.

The drain terminal of the unit cell 204 may also be coupled with a drain voltage Vd through an inductor, for example, an iron-core inductor 814. A capacitor 818 may represent an intrinsic output capacitance of the unit cell 204.

The input harmonic resonator 804, which may also be an internal series resonator, may include an inductor 824 and a capacitor 828 and operate similar to input harmonic resonators described above.

Figure 9:
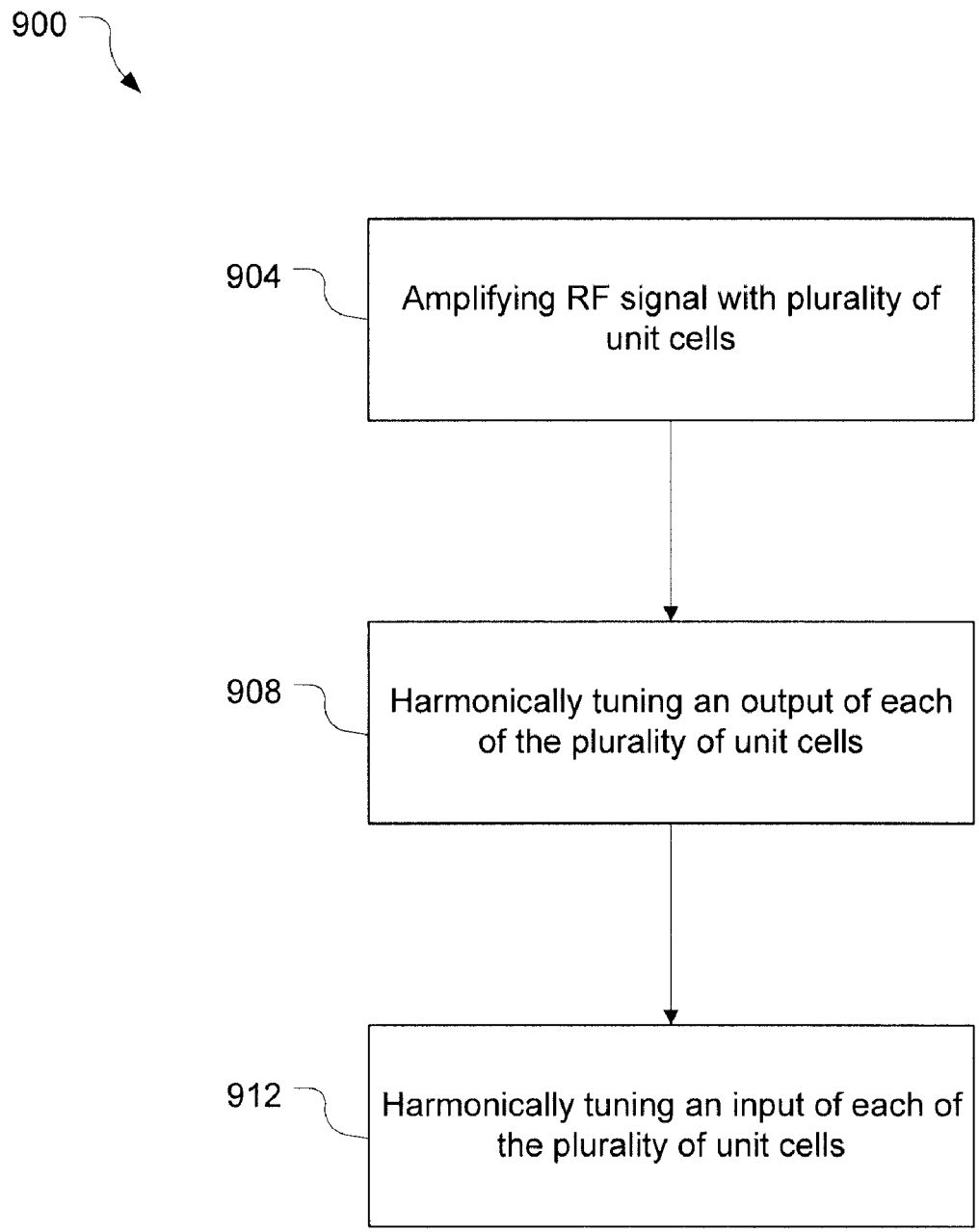
FIG. 9 is a flowchart illustrating operation of an amplification circuit in accordance with various embodiments.

FIG. 9 illustrates a flowchart 900 illustrating operation of an amplification circuit in accordance with various embodiments. At block 904, an RF signal may be amplified by a plurality of unit cells. As shown above, the unit cells may be coupled in parallel with one another. At block 908, an output of each of the plurality of unit cells may be harmonically tuned with a respective output harmonic resonator. As discussed above, the output harmonic resonators may be internal resonators. At block 912, an input of each of the plurality of unit cells may be harmonically tuned with a respective input harmonic resonator. Harmonic tuning of the inputs and/or outputs of the unit cells may be done as described with respect to any of the aforementioned embodiments.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit comprising:
   a plurality of unit cells, each having an input to receive a radio frequency (RF) signal and an output to transmit an amplified RF signal; and
   a plurality of output harmonic resonators respectively coupled with the outputs of the plurality of unit cells to provide harmonic termination impedances to the outputs of the plurality of unit cells, wherein each of the plurality of output harmonic resonators comprises a first inductor coupled in parallel with a capacitor and a second inductor coupled in series with the first inductor and the capacitor.

2. The circuit of claim 1, wherein the plurality of unit cells and the plurality of output harmonic resonators are implemented on a chip.

3. The circuit of claim 2, further comprising:
   a plurality of input harmonic resonators respectively coupled with the inputs of the plurality of unit cells to provide harmonic termination impedances to the inputs of the plurality of unit cells.

4. The circuit of claim 3, wherein each of the plurality of input harmonic resonators comprise an inductor coupled in series with a capacitor, the inductor having a first terminal coupled with the input of the unit cell and a second terminal coupled with the capacitor.

5. The circuit of claim 1, wherein each of the plurality of output harmonic resonators provide a series resonance at a second harmonic frequency of the amplified RF signal.

6. A circuit comprising:
   a plurality of unit cells disposed on a chip, each having an input to receive a radio frequency (RF) signal and an output to transmit an amplified RF signal; and
   one or more output harmonic resonators, disposed on the chip, coupled with outputs of the plurality of unit cells to harmonically tune an output impedance for each of the plurality of unit cells, wherein each of the plurality of output harmonic resonators comprises a first inductor coupled in parallel with a capacitor, and a second inductor coupled in series with the first inductor and the capacitor.

7. The circuit of claim 6, wherein the one or more output harmonic resonators comprise a plurality of output harmonic resonators that respectively correspond to the plurality of unit cells.

8. The circuit of claim 6, wherein the one or more output harmonic resonators are configured to provide a series resonance at the output of each of the plurality of unit cells at a second harmonic frequency of the RF signal to harmonically tune the output impedances.

9. The circuit of claim 6, wherein the one or more output harmonic resonators are configured to provide a parallel resonance at the output of each of the plurality of unit cells at a third harmonic frequency of the RF signal to harmonically tune the output impedances.

10. The circuit of claim 6, further comprising:
    one or more input harmonic resonators, disposed on the chip, coupled with inputs of the plurality of unit cells to harmonically tune an input impedance for each of the plurality of unit cells.

11. The circuit of claim 6, wherein each of the one or more harmonic resonators comprise:
    a spiral inductor and a metal-insulator-metal (MIM) capacitor.

12. A system comprising:
    a transmitter including a radio frequency (RF) power amplifier having amplification circuitry with a plurality of unit cells, each having an input
    to receive an RF signal and an output to transmit an amplified RF signal, and a plurality of output harmonic resonators respectively coupled with the
    outputs of the plurality of unit cells to provide harmonic termination impedances to the outputs of the plurality of unit cells, wherein each of the plurality of output harmonic resonators comprises a first inductor coupled in parallel with a capacitor, and a second inductor coupled in series with the first inductor and the capacitor; and
    an antenna structure coupled with the transmitter and configured to facilitate an over-the-air (OTA) transmission of the amplified RF signal.

13. The system of claim 12, wherein the plurality of unit cells and the plurality of output harmonic resonators are implemented on a chip.

14. The system of claim 12, wherein the RF power amplifier is a class E amplifier.

15. The system of claim 12, wherein the RF power amplifier is a class F amplifier.

16. A method comprising:
    amplifying, with a plurality of unit cells, a radio-frequency signal; and
    harmonically tuning an output of each of the plurality of unit cells with a respective one of a plurality of output harmonic resonators, wherein each of the plurality of output harmonic resonators comprises a first inductor coupled in parallel with a capacitor, and a second inductor coupled in series with the first inductor and the capacitor.

17. The method of claim 16, wherein the plurality of unit cells and the plurality of output harmonic resonators are implemented on a chip.

18. The method of claim 16, further comprising:
    harmonically tuning an input of each of the plurality of unit cells with a respective one of a plurality of input harmonic resonators.

19. A circuit comprising:
    a plurality of unit cells, each having an input to receive a radio frequency (RF) signal and an output to transmit an amplified RF signal; and
    a plurality of output harmonic resonators respectively coupled with the outputs of the plurality of unit cells to provide harmonic termination impedances to the outputs of the plurality of unit cells, wherein each of the plurality of output harmonic resonators comprises a first capacitor coupled in series with an inductor, and a metal-insulator-metal (MIM) capacitor coupled in parallel with the first capacitor and the inductor.

20. The circuit of claim 19, wherein the plurality of unit cells and the plurality of output harmonic resonators are implemented on a chip.

21. The circuit of claim 19, wherein each of the plurality of output harmonic resonators provide a series resonance at a second harmonic frequency of the amplified RF signal.

22. The circuit of claim 19, wherein the one or more output harmonic resonators are configured to provide a parallel resonance at the output of each of the plurality of unit cells at a third harmonic frequency of the RF signal to harmonically tune the output impedances.

23. The circuit of claim 19, wherein each of the one or more harmonic resonators comprise:
 a spiral inductor and a metal-insulator-metal (MIM) capacitor.

\* \* \* \* \*